United States Patent [19]
Rostoker

[11] Patent Number: 5,759,921
[45] Date of Patent: Jun. 2, 1998

[54] INTEGRATED CIRCUIT DEVICE FABRICATION BY PLASMA ETCHING

[75] Inventor: Michael D. Rostoker, Boulder Creek, Calif.

[73] Assignee: LSI Logic Corporation, Milpitas, Calif.

[21] Appl. No.: 531,727

[22] Filed: Sep. 21, 1995

[51] Int. Cl.⁶ .................................................. H01L 21/00
[52] U.S. Cl. ........................... 438/711; 438/719; 216/67
[58] Field of Search .......................... 156/643.1, 644.1, 156/646.1, 650.1, 653.1; 216/67; 204/298.34, 192.37, 192.32; 438/710, 711, 719, 729, 730

[56] References Cited

U.S. PATENT DOCUMENTS

| | | | |
|---|---|---|---|
| 5,277,751 | 1/1994 | Ogle | 156/643 |
| 5,401,350 | 3/1995 | Patrick et al. | 156/345 |

*Primary Examiner*—R. Bruce Breneman
*Assistant Examiner*—Luz Alejandro
*Attorney, Agent, or Firm*—Hickman Beyer & Weaver, LLP

[57] ABSTRACT

An anisotropic etching process is disclosed in which two sources of process gas are provided to a plasma reactor having at least three electrodes. In a plasma, the first process gas provides etchant species which are reactive with a substrate and the second process gas provides barrier species which protect trench sidewalls from reaction with the etchant species. For etching silicon, the first process gas may be chlorine, chloro-trifluoromethane, oxygen, etc., and the second process gas may be $C_2F_6$, $SF_6$, $BCl_3$, or other compound that either combines with etchant species on a trench sidewall or forms a protective polymer film on such trench sidewall. A disclosed plasma reactor includes a grounded first electrode which forms part of the reactor's enclosure, a coiled second electrode disposed above and separated from the reactor enclosure by a dielectric shield, and a planar third electrode located below the substrate to be etched. A plasma is generated by providing radio frequency energy from the second electrode to the enclosure interior. The charged species from that plasma are directed to the substrate by applying a bias between the first and third electrodes.

15 Claims, 4 Drawing Sheets

INTEGRATED CIRCUIT DEVICE FABRICATION BY PLASMA ETCHING

BACKGROUND OF THE INVENTION

The present invention relates generally to methods of forming trenches in wafers during fabrication of integrated circuits ("ICs"). More particularly, the invention relates to methods of forming such trenches by highly anisotropic plasma etching in reactors having three or more electrodes and employing chemical reactants that passivate trench sidewalls during etching.

Trenches in semiconductor substrates may serve various functions in integrated circuits. For example, trenches may electrically isolate MOS devices from one another on integrated circuits. They may also serve as part of a capacitor in "trench capacitor type" dynamic random access memory chips ("DRAMs"). In such DRAMs, each trench capacitor stores a single bit which may be either a 1 or a 0 depending upon whether the capacitor is charged or uncharged.

Trenches are particularly attractive for such applications because they utilize a substrate's third dimension (i.e., the direction normal to the substrate surface), and therefore occupy only very little area on the top surface of the substrate. While other structures for device isolation and capacitor formation can provide somewhat densely packed devices, trench-based structures generally require even less chip area. For example, when trenches are used for device isolation, they occupy far less area than the other commonly used major isolation structure: field oxides. Further, when trenches are used as capacitors in DRAMs, the trench capacitors occupy less substrate surface area than most other DRAM capacitor types (e.g., planar and stacked capacitors).

While trenches provide space saving advantages for certain applications, further improvements in device density may require trenches of increasing depth to width ratio (i.e., increasing aspect ratio). This is particularly true for trench capacitors in DRAM applications because each trench capacitor of a DRAM must be capable of storing a certain minimum amount of charge in order to ensure that information is not lost between refresh cycles. As the amount of stored charge in a trench type capacitor is directly proportional to the surface area of the trench itself, any surface area lost in narrowing the trench must be made up elsewhere. More generally, the capacitance of the trench capacitor must be maintained even as device sizes and spacing between devices decrease.

The capacitance of a trench capacitor may be increased in three ways. First, as noted, it may be increased by increasing the surface area of the capacitor plates (e.g., the trench walls). Second, it may be increased by increasing the dielectric constant of an insulator separating the plates, and finally, it may be increased by reducing the thickness of the insulator. While some work has focused on engineering trench dielectrics to be thinner dielectrics or have higher dielectric constants, such efforts are not particularly relevant to the invention described herein.

Some effort has focused on making narrow trench capacitors deeper so as to provide increased surface area. While this approach has yielded some improvements in device density, it is believed that to develop 64 megabit or greater trench-type DRAMs, trenches having submicron widths and aspect ratios of at least about 2.5 to 1 (depth to width) must be formed. However, trench capacitors in current 16 megabit DRAMs produced by Texas Instruments Corporation have widths of about 1.5 µm and depths of only about 2.85 µm. Unfortunately, available trench forming techniques have not yet proved able to reliably attain submicron trenches of the depth to width ratios necessary to reach the 64 megabit requirements.

In an effort to provide greater surface area to DRAM capacitors, some companies have employed "fin-type" capacitors. For example, in its 64 megabit DRAM, Hitachi Corporation has employed one fin-type capacitor in each DRAM cell. While providing somewhat increased capacitance on available chip surface area, fin-type capacitors have complex shapes and are therefore somewhat difficult to fabricate. Thus, if possible, it would be desirable to develop increased density DRAMs with the simpler trench-based technology.

Trenches are conventionally formed by an anisotropic chemical or reactive ion etching step on a masked substrate. Anisotropic etching refers to etching that is primarily vertical, without significant lateral undercutting. As should be apparent, deep narrow trenches can only be formed by highly anisotropic etches. The anisotropy of an etch can be controlled by various parameters. Conditions promoting anisotropic trenches include low reactor pressure, high bias for directing charged plasma species toward the substrate, and etch chemistries that provide protections of sidewalls. In general, the faster and more strongly that a particular plasma species reacts with a given substrate material, the more isotropic the etch. For example, fluorine radicals very rapidly react with silicon to form volatile $SiF_4$ which then rapidly diffuses from the reaction site to provide a fresh surface for further reaction. Thus, fluorine etches of silicon generally proceed isotropically and are therefore unsuitable, when used alone, for etching trenches. Less strongly reacting species therefore sometimes have been used to promote a more isotropic etch.

Unfortunately, controlling the plasma etch chemistry alone, in the manner suggested, likely cannot yield etches of sufficient anisotropy to produce the deep trenches required for next generation trench-type DRAMs. Thus, what is needed is an improved method and apparatus for producing deep narrow trenches in chemical etching systems.

SUMMARY OF THE INVENTION

The present invention meets the aforementioned requirement by providing an anisotropic etching process performed in a plasma reactor having at least three electrodes and employing at least two different chemical species: an etchant species and a barrier species. In a plasma, a first process gas provides the etchant species which is reactive with a substrate and a second process gas provides the barrier species which protects trench sidewalls from reaction with the etchant species. The three electrodes generate a uniform plasma that can be carefully directed onto the substrate. Prior systems that employed first and second gas sources for simultaneous etching and protection were insufficiently controllable because they employed plasma reactors having only two electrodes.

In a three electrode plasma reactor as used with the present invention, two of the electrodes may be employed to produce an electromagnetic field that is parallel with the plane of the wafer to be etched, thus producing a plasma that is highly uniform over the surface of the wafer. The third electrode directs the plasma onto the wafer in a highly controlled manner. In the past, when reactive and passivating species were used in tandem, one of the two available reactor electrodes was used for two purposes (i.e., to generate the plasma and to direct it onto the wafer). Unfortunately, such systems provided inadequate control over the uniformity and/or vertical component of the etch.

In one aspect, the invention provides a trench etching method that can be characterized by the following steps: (1) supporting a substrate within an enclosure; (2) providing a first chemical reactant and a second chemical reactant to the enclosure; (3) generating a plasma about the substrate by applying a potential between a first and a second electrode, the plasma containing an etchant species from the first chemical reactant and a barrier species from the second chemical reactant; and (4) directing charged species from the plasma onto the substrate by applying a potential to a third electrode. During the etching process, the etchant species reacts with the substrate to remove material from the trench and the barrier species impedes reaction of the etchant with sidewalls of the trench.

Preferably, the wafer and three electrodes are aligned as follows. A support holds the substrate in a defined plane. The first electrode is located on the enclosure and is oriented substantially perpendicular to the plane defined by the substrate. This first electrode may actually form part of the reactor enclosure. The second electrode preferably is a substantially planar coil located above the substrate and oriented substantially parallel to the defined plane. Finally, the third electrode is located beneath the substrate and is oriented substantially parallel with the defined plane. A uniform plasma may be generated in this system by providing a radio frequency potential to the second electrode such that a planar radio frequency electromagnetic field is inductively coupled to the process gases in the reactor enclosure. The resulting uniform plasma can then be directed onto the substrate by applying a potential to a third electrode located beneath the substrate.

As noted, the etchant species in the reactor reacts with the substrate to remove material from the trench and the barrier species impedes reaction of the etchant with sidewalls of the trench. Preferably, the first chemical reactant (i.e., the source of etchant species) provided to the enclosure includes one or more of the following: diatomic chlorine, diatomic bromine, oxygen, and chloro-trifluoromethane (for etching silicon). Further, the second chemical reactant provided to the enclosure preferably includes a compound selected from the group consisting of fluorocarbon molecules and sulfur fluorides (for passivating silicon etches), and $BCl_3$ (for passivating aluminum etches).

Another aspect of the invention provides an apparatus for etching a trench in a substrate. In this aspect, the apparatus may be characterized as including: (1) a source of a first chemical reactant which is capable of providing etchant species in a plasma; (2) a source of a second chemical reactant which is capable of forming barrier species on an etched surface of the substrate; (3) an enclosure having an interior in fluid communication with the sources of the first and second chemical reactants; (4) a support for the substrate located within the interior of said enclosure and holding the substrate in a defined plane; (5) a first electrode and a second electrode arranged such that a radio frequency signal supplied to one of the first or second electrodes provides radio frequency energy to the interior of the enclosure; and (6) a third electrode disposed below the support. Preferably, the three electrodes are oriented as described above. Further, the chemical species employed to etch and passivate preferably are as listed above.

These and other features and advantages of the invention will be described in more detail below with reference to the drawings.

DETAILED DESCRIPTION OF THE PREFERRED EMBODIMENTS

Figure 1:
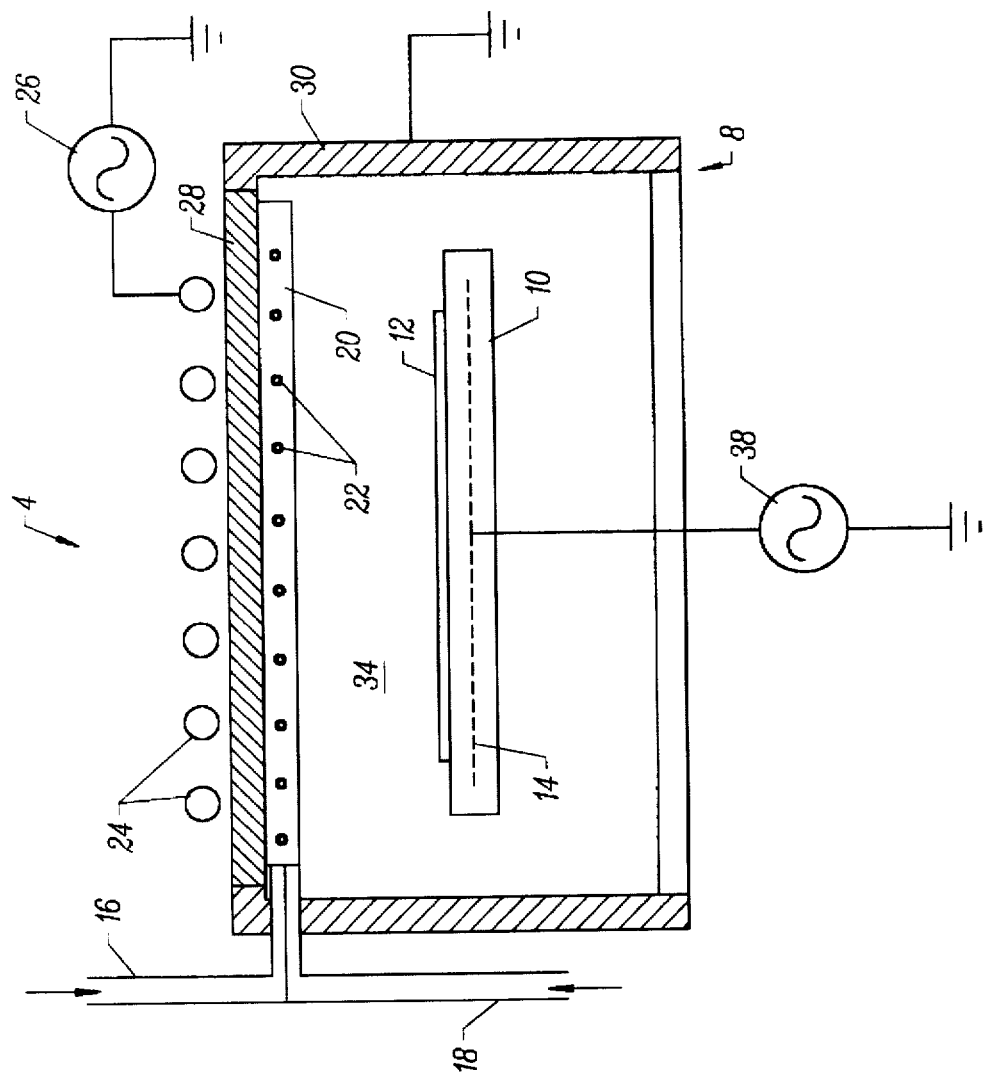
FIG. 1 is a cross-sectional view of a three-electrode system that may be used to implement a preferred embodiment of the present invention.

A preferred embodiment of the present invention will be described with reference to FIG. 1. A cross section of a three-electrode plasma reactor 4 includes an enclosure 8 having an interior space containing a wafer support 10 and a wafer 12 to be processed. As shown, the support 10 holds the wafer 12 in a defined plane (horizontal in this embodiment) with respect to the enclosure 8. The wafer may be mechanically clamped to the support. However, in one preferred embodiment, the support 10 is an electrostatic chuck which holds the wafer 12 in place without bowing. Such electrostatic chucks are described in Singer "Electrostatic Chucks in Wafer Processing" Semiconductor International, pp. 57–64 (April 1995) which is incorporated herein by reference for all purposes. The entire enclosure 8 can be evacuated to very low pressures with a turbomolecular pumping system (not shown).

A first process gas is provided to the plasma reactor interior via a line 16, and a second process gas is provided to the plasma reactor interior via a line 18. The first and second process gases enter the reactor interior through a diffuser or gas distribution member 20 which has a plurality of nozzles 22. Specifically, the gases enter distribution member 20 from lines 16 and 18 and then are uniformly delivered to the reactor interior through nozzles 22.

Once in the reactor interior, the gases are converted to a plasma by radio frequency excitation. This is accomplished by applying a radio frequency signal to a coiled planar electrode 24 from a source of radio frequency energy 26. An electromagnetic field emanating from electrode 24 is inductively coupled to the reactor interior through a dielectric shield 28 and sets up an oscillating potential with respect to a grounded electrode 30. It should be noted that dielectric shield 28 and grounded electrode 30 together form part of enclosure 8. Further, the electrode 24 is oriented substantially in parallel with the wafer 12, and the electrode 30 is oriented substantially perpendicular to the wafer 12. The field resulting from the potential difference between electrodes 28 and 30 excites the free electrons and charged species in the gas to generate a plasma in region 34 above the wafer 12. A third electrode located in support 10 directs the charged species in the plasma onto wafer 12 to assist the etching process. This third electrode preferably lies in the same plane as the wafer and is also controlled by a source of radio frequency energy 38. In especially preferred embodiments, the top planar electrode 24 and the bottom planar electrode (located in support 10) are driven by separate 13.56 MHz radio frequency power supplies.

As noted, the three electrode system described here separates the plasma generation and bias functions. Electrodes 24 and 30 control the plasma generation function and allow formation of large uniform plasmas capable of uniformly etching large substrates (e.g., on the order of 200 mm). In addition, a DC bias between electrodes 24 and 14 independently controls the ion bombardment energy. One exemplary three electrode system providing such separation of functions is the TCP 9400 reactor available from Lam Research Corporation of Fremont, Calif. In two electrode systems, such as those described above, the plasma generation and bombardment functions are not separated, which leads to an inherently less controllable etch.

For a given plasma chemistry, optimal or nearly optimal reactor conditions for anisotropic etching can be reproducibly obtained by adjusting such parameters as the total pressure within the reactor, the partial pressures of the individual gases, the radio frequency power, and the DC bias between electrodes 24 and 14. Generally, as the total pressure in a plasma reactor decreases, the etch becomes more anisotropic. In many reactors, for example, the total pressure should be on the order of a few millitorr (1 to 10 millitorr) or less where the mean free paths of the reactant and product species are large in comparison to the reactor geometry. However, the systems of this invention are versatile enough to be useful at higher pressures such as those above 100 millitorr. The DC bias also effects etch anisotropy. Generally, as the DC bias increases, the etch anisotropy also increases In a typical reactor, the bias should be on the order of a few tens of watts, and the total radio frequency induction power on the order of a few hundred watts.

In some embodiments of this invention, four or more electrodes may be employed to achieve higher power and/or greater control of the etching process. Thus, for example, either or both of single electrodes 24 and 14 may be replaced concentric electrodes. In addition, for reactors designed to process multiple wafers simultaneously, it may be desirable to employ an additional electrode under each wafer region to improve process control and increase power.

Various gases may be used for the first and second chemical sources. In general, however, the first chemical source should be a material that can generate chemical species (so-called etchant species) in a plasma which will react with the material to be etched. Further, the second chemical source should be a material which will, in a plasma, generate chemical species (so-called barrier species) that can impede the etching of a substrate material by chemical species from the first chemical source.

Typically, the chemical species generated by the first chemical source in a plasma will be uncharged radicals that are particularly reactive with the material to be etched. Further, the reaction product of that etch should be a volatile or other easily removable material. For example, if the material to be etched in the substrate is silicon, an appropriate etchant is a source of chlorine radicals because the reaction product, silicon tetrachloride is quite volatile and easily removed from the substrate. For etching silicon, suitable etchant compounds include chlorine, bromine, chloro-trifluoromethane, and oxygen. For etching aluminum, suitable enchant compounds include carbon tetrachloride, and boron trichloride.

The nature of such chemical etching is inherently isotropic. To produce a more anisotropic etch, the present invention employs the second chemical source. Suitable compounds for use as the second chemical source include $C_2F_6$ and $SF_6$ for silicon etching, $BCl_3$ for aluminum etching, etc. In general, compounds for the second chemical species may act by a variety of mechanisms. For example, the second chemical material may impede the etching reaction by forming protective polymer films on the etched surface. Such materials can be produced in plasma from fluorocarbons such as $C_2F_6$, $CF_3Cl$, from hydrocarbons (particularly unsaturated hydrocarbons) and from $SF_6$. A general description of passivation by polymerization is described in "VLSI FABRICATION PRINCIPLES" Second edition by S. K. Ghandhi, John Wiley & Sons, Inc., New York, N.Y. 1994 which is incorporated herein by reference for all purposes.

It should be understood that a variety of other chemical reactants may be purposely added to a plasma reactor in order promote anisotropic etching. In general, purposely added reactants should be gaseous at room temperature in order to facilitate plasma their conversion to plasma. However, this need not always be the case. and, in fact, some reactants need not even form part of the plasma. Such materials may be present in the reactor regardless of the specific etch chemistry selected. For example, some masking materials such as oxides, nitrides, and/or photoresists are sputtered into the trench during the etch process. These materials may actually promote anisotropic etching by protecting trench sidewalls as explained in U.S. Pat. application Ser. No. 08/531,473, filed on the same day as the present invention, naming M. Rostoker as inventor, and entitled "METHOD OF MAKING TRENCH CAPACITORS" and incorporated herein by reference for all purposes.

Figure 2:
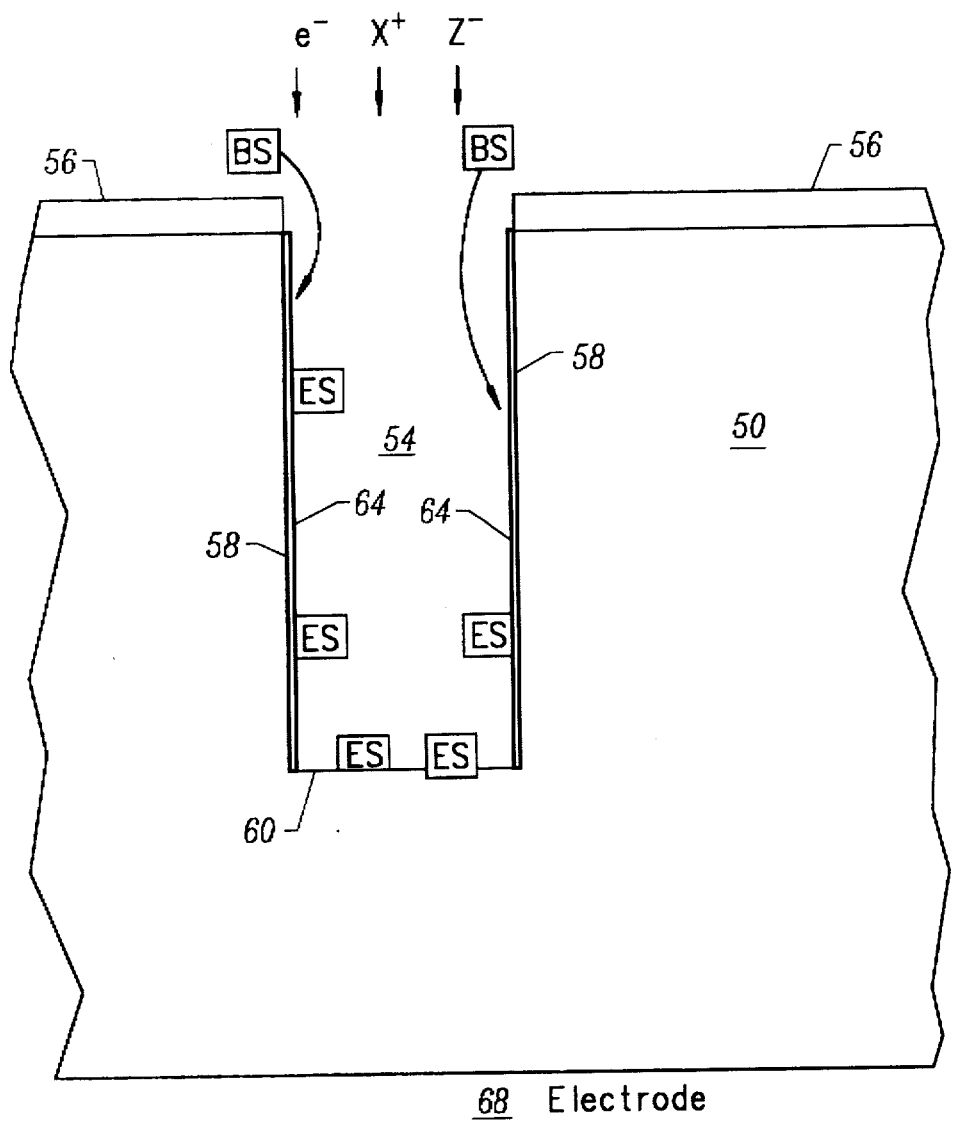
FIG. 2 is a cross-sectional view of a trench being formed in silicon in accordance with the present invention.

While not wishing to be bound by theory, it is believed that FIG. 2 illustrates how the etchant and barrier species might interact in a process of this invention. Specifically, a uniform plasma 52 is directed onto a substrate 50 to form a trench 54. A mask 56 defines the trench dimensions on the top surface of substrate 50. The plasma 52 will include free electrons and ions (illustrated as $e^-$, $X^+$, and $Z^-$) as well as radicals (illustrated as etchant species ES and barrier species BS). Together these plasma components will carve sidewalls 58 and floor 60 of trench 54. The barrier species BS accumulate on trench sidewalls 58 to form barrier regions 64. The etchant species ES react rapidly with the trench floor 60 to continue increasing the trench depth, but they react only slowly with the trench sidewalls 58 where they encounter protective barriers 64. As noted the sidewall barriers may be, for example, protective polymeric films or other species that protect the sidewall from etchant species ES.

The free electrons and/or ions are directed into the trench by an electrode 68 disposed below the substrate 50. The interaction of these species with the substrate is primarily by momentum transfer in the vertical direction. Thus, they tend to act on trench floor 60. There they strip away any protective barrier that may be forming (i.e., a barrier analogous to barrier regions 64). This allows the etchant species ES to continue reacting with trench floor 60. Further, the momentum imparted by the electrons and ions may also damage the substrate lattice in the vicinity of trench floor 60, thus allowing the etchant species ES to react more rapidly.

It should be understood that while plasma processes that rely primarily upon momentum transfer (deemed "physical etching" and including such processes as ion milling and sputtering) are inherently anisotropic, they are also rather nonselective. That is, they tend to etch all materials at about equal rates. Thus, they are unsuitable for forming trenches as both masks and substrates are etched at about the same rate. Hence the processes of this invention will rely on chemical, as well as physical etching mechanisms. Conventional systems that rely on both chemical and physical etching mechanisms include systems for reactive ion etching, plasma assisted dry chemical etching, etc. The present invention is directed to modified versions of these conventional systems, with the modifications being (1) the use of a three or more electrode reactor to provide good plasma control and uniformity, and (2) the use of both etching and passivating chemical species in the reactor.

As noted, the present invention finds applications in forming high density high capacitance trench capacitors for next generation DRAMs. In such devices, the semiconductor substrate forms one electrode of the capacitor, a thin layer dielectric lining the trench walls forms the insulator of the capacitor, and a plug of polysilicon in the trench forms the second electrode of the capacitor. A charged trench capacitor represents a logical 1, and an uncharged trench capacitor represents a logical 0.

As noted, high density packing of trench capacitors on a chip, requires trenches having high aspect ratios. Referring again to FIG. 2, the relevant dimensions are defined as follows. The distance between trench sidewalls 58 defines the trench width (at least at the top of the trench) and the distance between the top of the substrate and the trench floor 60 defines the trench depth. Preferably, a trench formed in accordance with this invention will have an aspect ratio (defined as depth to width) of at least about 2.5:1, more preferably at least about 3.0:1, even more preferably at least about 3.25:1, and most preferably at least about 3.5:1.

Figure 3A:
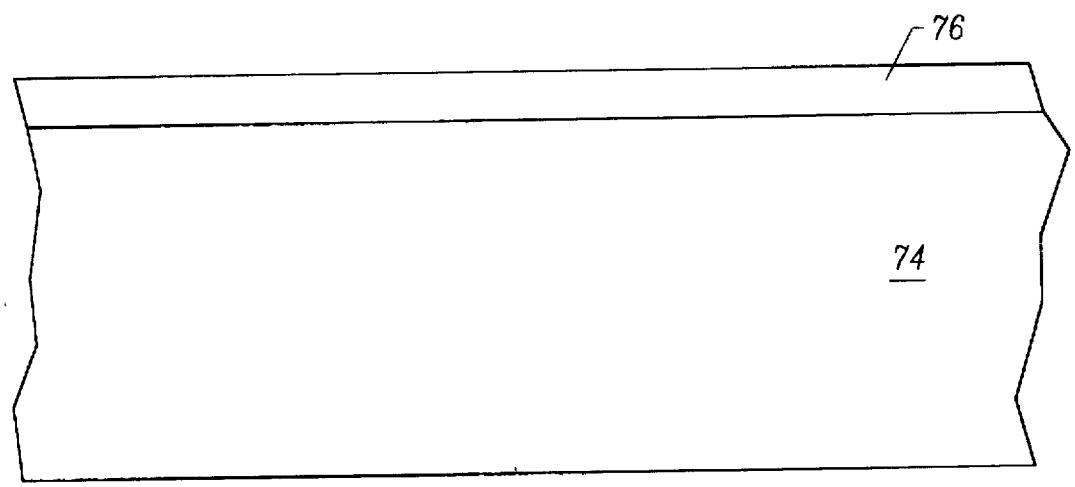
FIGS. 3a–3f are cross-sectional views of a substrate at various stages of trench capacitor fabrication.

Various well-known process flows can be employed for fabricating trench capacitors utilizing trenches prepared in accordance with this invention. One suitable fabrication process flow for forming a trench capacitor will now be detailed with reference to FIGS. 3a to 3f. The process begins as shown in FIG. 3a with a substrate 74 having a mask layer 76 provided on the top surface thereof. The substrate 74 is typically a uniformly and lightly p doped single crystal silicon wafer. However, it may of course be an n doped silicon and/or include regions of nonuniform doping and may even include an epitaxial layer. The mask layer 76 is chosen to resist attack by the etchant subsequently used to form the trench. Preferably, mask layer 76 will be silicon oxide, silicon nitride, or alternating layers of silicon oxide and nitride.

Figure 3B:
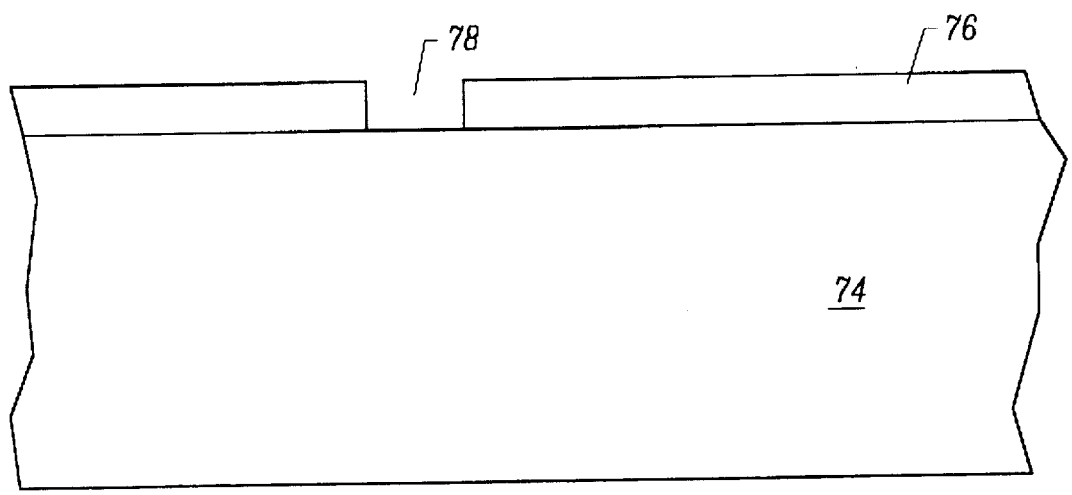

The mask layer 76 is patterned as shown in FIG. 3b to define an exposed region 78 on the top surface of substrate 74. In general, the mask will include regions containing an etchant resistant material (e.g., oxide or nitride) which protects the underlying semiconductor material during etch, and exposed regions which define locations where trenches are to be etched. The patterning process may be performed by photolithography for example. After the mask is formed, a plasma etch is performed in accordance with this invention to produce the structure shown in FIG. 3c. Thus, the etch will be performed in a reactor having three or more electrodes and in the presence of chemical etchant species and barrier species. The etching process will carve a trench 80 in substrate 74 while providing barrier regions 82 on the sidewalls of trench 80.

Figure 3C:
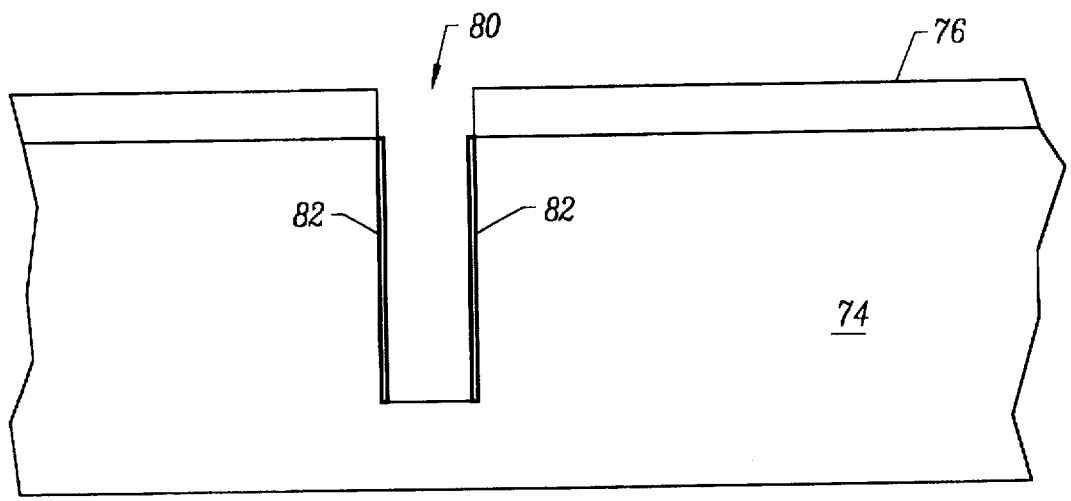
Figure 3D:
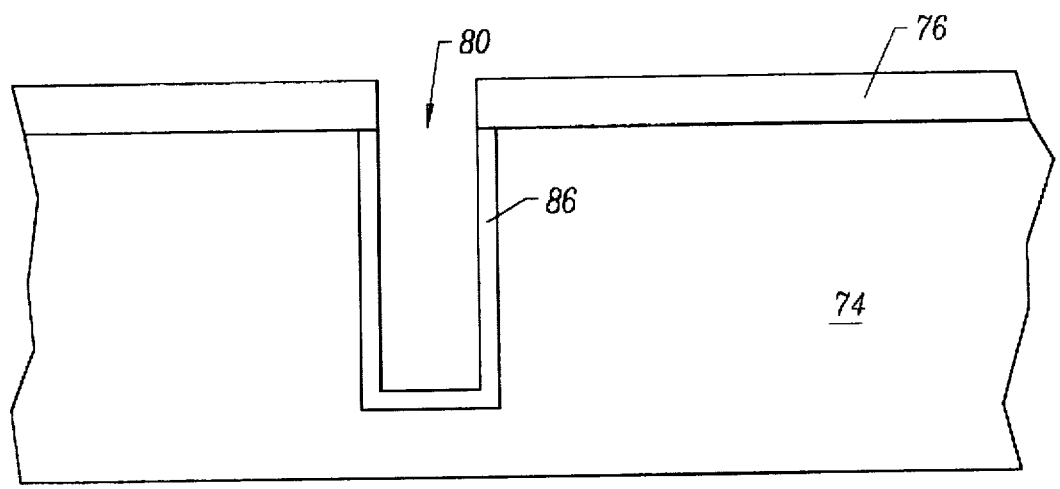
Figure 3E:
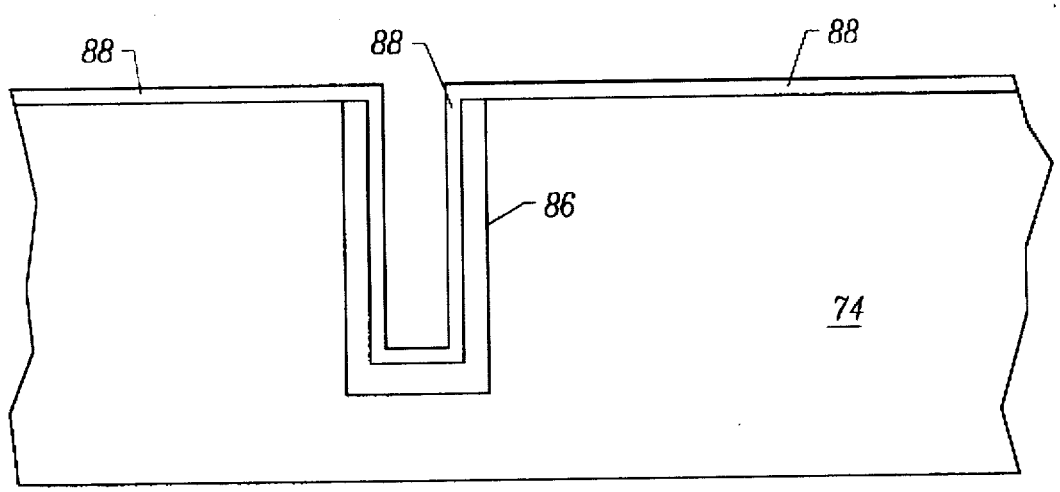
Figure 3F:
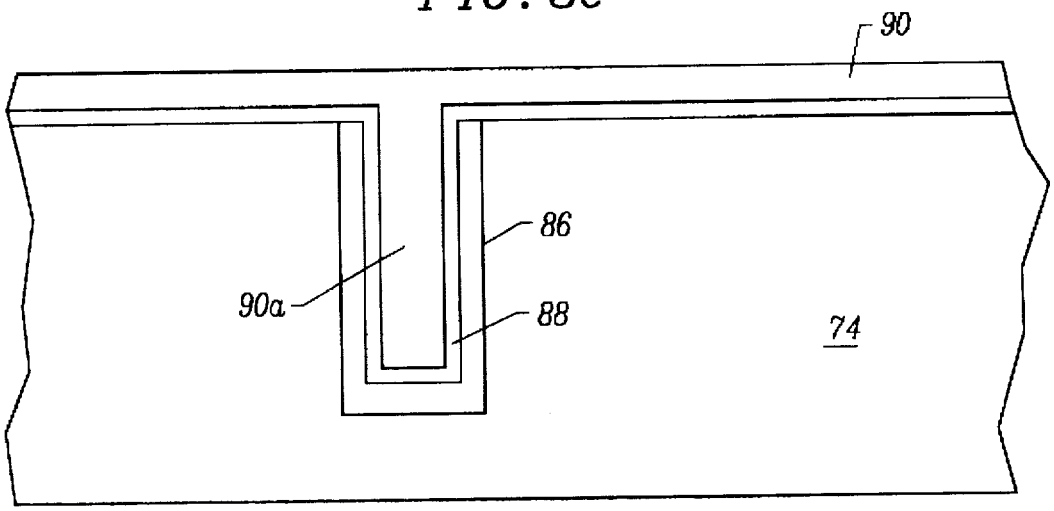

After the deep trench has been formed as indicated in FIG. 3c, an implant is conducted to form an n+ region 86 on the sidewalls and floor of trench 80. Region 86 serves as one plate of the subsequently completed trench capacitor. Region 86 may be formed by a variety of alternative techniques such as diffusion from a solid source or from a gas-phase dopant source species.

After forming region 86, mask layer 76 is removed by a wet etch, chemical mechanical polishing, or other suitable process. Thereafter, a thin dielectric layer 88 of oxide or nitride for example is conformally deposited over the trench 80 and exposed surface of substrate 74 to provide the structure shown in FIG. 3e. Other high dielectric materials may used in place of an oxide or nitride to further increase the capacitor's capacitance. Finally, a layer of polysilicon 90 is conformally deposited on the substrate surface to produce the structure shown in FIG. 3f. The polysilicon that fills trench 80 forms the second plate 90a of the trench capacitor.

In a DRAM, the trench capacitor formed as shown in FIGS. 3a through 3f forms part of a single memory cell that also includes an MOS transistor (not shown). The gate of such transistor is connected to a word line, one drain/source of the transistor is connected to the n+ region 86, and the other drain/source is connected to a bit line. Using the methods and apparatus of this invention to form deep trenches, capacitors having aspect ratios of 2.5:1 (depth to width) or more can be formed and used on DRAM chips of gigabit or larger capacity.

Although a preferred embodiment of the present invention has been described in detail, it should be understood that the present invention may be embodied in many other specific forms without departing from the spirit or scope of the invention. Particularly, it should be understood that the exact sizing, shaping, and placement of the reactor electrodes may be widely varied within the scope of the present invention. Further, the exact material compositions of the source gases can be varied somewhat and still provide good anisotropic etching within the scope of this invention. Therefore, the present embodiments are to be considered as illustrative and not restrictive, and the invention is not to be limited to the details given herein, but may be modified within the scope of the appended claims.

What is claimed is:

1. A method of etching a trench in a substrate having a surface, the method comprising the following steps:
   supporting said substrate within an enclosure;
   providing a first chemical reactant and a second chemical reactant to said enclosure;
   generating a plasma about said substrate, by applying a potential between a first and a second electrode, the second electrode including a coil electrically coupled to a radio frequency power source, the potential being produced by a radio frequency signal in the second electrode. The plasma containing etchant species from the first chemical reactant and barrier species from the second chemical reactant;
   directing charged species from said plasma onto said substrate by applying a potential to a third electrode, whereby the etchant species reacts with substrate to remove material from the trench and the barrier species impedes reaction of the etchant species with sidewalls of the trench;
   and wherein the trench has an aspect ratio of at least 2.5:1, said aspect ratio representing the ratio of the trench's depth to the trench's width of the substrate.

2. The method of claim 1 wherein the substrate is supported in a defined plane, and wherein the first electrode is located on said enclosure and oriented substantially perpendicular to said defined plane, and the second electrode is located above the substrate and oriented substantially parallel to said defined plane, with the potential being produced by a radio frequency signal in the second electrode.

3. The method of claim 2 wherein in the step of directing charged species from the plasma onto the substrate, the third electrode is located beneath the substrate and is oriented substantially parallel with the defined plane.

4. The method of claim 1 wherein in the step of generating plasma, the second electrode is a substantially planar coil.

5. The method of claim 1 wherein the first chemical reactant provided to the enclosure includes one or more compounds selected from the group consisting of chlorine, bromine, oxygen, and chloro-trifluoromethane.

6. The method of claim 1 wherein the second chemical reactant provided to the enclosure includes one or more compounds selected from the group consisting of boron trichloride, fluorocarbon molecules, and sulfur fluorides.

7. The method of claim 1 wherein the substrate is silicon.

8. The method of claim 7 further comprising a step of forming a patterned mask layer on a surface of said silicon substrate.

9. The method of claim 8 further comprising steps of forming complete devices on the silicon substrate such that an integrated circuit is formed.

10. A method of etching a trench in a substrate having a surface covered by a patterned mask, the method comprising the following steps:

providing said substrate to a support within an enclosure, the support holding the substrate in a defined plane;

providing a first chemical reactant and a second chemical reactant to said enclosure;

generating a plasma within said enclosure by applying a potential between a first and a second electrode, the first electrode being located on said enclosure and oriented substantially perpendicular to said defined plane, the second electrode being located above the substrate and oriented substantially parallel to said defined plane, the second electrode including a coil electrically coupled to a radio frequency power source, the potential being produced by a radio frequency signal in the second electrode, the plasma containing etchant species from the first chemical reactant and barrier species from the second chemical reactant;

directing charged species from said plasma onto said substrate by applying a potential to a third electrode located beneath the substrate, whereby the etchant species reacts with the substrate to remove material from the trench and the barrier species impedes reaction of the etchant species with the sidewalls of the trench;

and wherein the trench has an aspect ratio of at least 2.5:1, said aspect ratio representing the ratio of the trench's depth to the trench's width of the substrate.

11. The method of claim 10 wherein in the step of generating plasma, the second electrode is a substantially planar coil.

12. The method of claim 10 wherein the first chemical reactant provided to the enclosure includes one or more compounds selected from the group consisting of chlorine, bromine, oxygen, and chloro-trifluoromethane.

13. The method of claim 10 wherein the second chemical reactant provided to the enclosure includes one or more compounds selected from the group consisting of boron trichloride, fluorocarbon molecules, and sulfur fluorides.

14. The method of claim 10 wherein the substrate is silicon.

15. The method of claim 10 further comprising steps of forming complete devices on the silicon substrate such that an integrated circuit is formed.

\* \* \* \* \*